United States Patent
Zhu et al.

(10) Patent No.: US 9,189,329 B1
(45) Date of Patent: Nov. 17, 2015

(54) GENERATING ERROR CORRECTING CODE (ECC) DATA USING AN ECC CORRESPONDING TO AN IDENTIFIED ECC PROTECTION LEVEL

(71) Applicant: MARVELL INTERNATIONAL LTD., Hamilton (BM)

(72) Inventors: Jun Zhu, San Jose, CA (US); Joseph Jun Cao, Los Gatos, CA (US); Sheng Lu, Monte Sereno, CA (US); Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 218 days.

(21) Appl. No.: 13/648,207

(22) Filed: Oct. 9, 2012

Related U.S. Application Data (60) Provisional application No. 61/546,846, filed on Oct. 13, 2011.

(51) Int. Cl.
G11C 29/00 (2006.01)
G06F 11/00 (2006.01)
G06F 11/10 (2006.01)
G11C 16/34 (2006.01)

(52) U.S. Cl.
CPC ........ *G06F 11/1048* (2013.01); *G06F 11/1008* (2013.01); *G06F 11/1044* (2013.01); *G11C 16/3418* (2013.01)

(58) Field of Classification Search
None
See application file for complete search history.

(56) References Cited

U.S. PATENT DOCUMENTS

| | | | |
|---|---|---|---|
| 4,858,349 A | 8/1989 | Walsh et al. | |
| 6,167,548 A | 12/2000 | Yamakura | |
| 6,193,499 B1 | 2/2001 | Klaus et al. | |
| 6,662,333 B1 * | 12/2003 | Zhang et al. | 714/767 |
| 6,747,827 B1 * | 6/2004 | Bassett et al. | 360/53 |
| 7,117,421 B1 * | 10/2006 | Danilak | 714/763 |
| 7,404,137 B2 * | 7/2008 | Lin et al. | 714/768 |
| 7,437,597 B1 * | 10/2008 | Kruckemyer et al. | 714/6.11 |
| 7,676,730 B2 * | 3/2010 | Haugan et al. | 714/769 |
| 7,975,205 B2 * | 7/2011 | Thayer | 714/763 |
| 8,185,801 B2 * | 5/2012 | Dell et al. | 714/763 |
| 2002/0029315 A1 * | 3/2002 | Williams et al. | 711/105 |
| 2003/0037299 A1 * | 2/2003 | Smith | 714/763 |
| 2006/0059406 A1 * | 3/2006 | Micheloni et al. | 714/763 |
| 2009/0013233 A1 * | 1/2009 | Radke | 714/752 |
| 2009/0144598 A1 * | 6/2009 | Yoon et al. | 714/752 |
| 2012/0233498 A1 * | 9/2012 | Ramaraju et al. | 714/23 |
| 2012/0284587 A1 * | 11/2012 | Yu et al. | 714/773 |
| 2013/0132799 A1 | 5/2013 | Zhu et al. | |
| 2014/0136927 A1 * | 5/2014 | Li et al. | 714/768 |
| 2015/0106556 A1 * | 4/2015 | Yu et al. | 711/103 |

OTHER PUBLICATIONS

U.S. Office Action in U.S. Appl. No. 13/682,552, dated Apr. 25, 2014, 6 pages.

* cited by examiner

*Primary Examiner* — Justin R Knapp (57) ABSTRACT

A memory controller provides error correcting code (ECC) capability for a memory. In some implementations, the controller is configured to identify an ECC protection level from a plurality of ECC protection levels for data that is to be stored in the memory device, generate ECC data for the data that is to be stored in the memory device using an ECC corresponding to the identified ECC protection level, store the generated ECC data in the cache, and store the data in the memory device.

16 Claims, 7 Drawing Sheets

GENERATING ERROR CORRECTING CODE (ECC) DATA USING AN ECC CORRESPONDING TO AN IDENTIFIED ECC PROTECTION LEVEL

CROSS REFERENCE TO RELATED APPLICATION

This disclosure claims the benefit of the priority under 35 U.S.C. §119(e) of U.S. Provisional Application No. 61/546,846, filed on Oct. 13, 2011, and titled "An ECC Method and System for Non-ECC DDR Configurations," the disclosure of which is hereby incorporated by reference in its entirety.

FIELD OF USE

The present disclosure relates to error correcting code (ECC) capability for memory.

BACKGROUND

A memory device, such as dynamic random-access memory (DRAM), can include memory cells. Each memory cell can typically store one bit of information by holding or not holding a charge in, for example, a capacitor. The presence or absence of a charge indicates, for example, logic 1 when a charge is stored, and logic 0 when no charge is stored. Electrical disturbance, such as interference from noise or radiation, can change the contents of one or more memory cells or interfere with the circuitry used to read and write data to the memory cells. Furthermore, memory devices are being designed to operate at increasingly higher throughput rates and lower power consumption, which can lead to increasingly higher bit error rates. A bit error can cause corruption of data, security vulnerabilities, or a system crash.

Error correcting code (ECC) can be used to detect and correct bit errors. ECC encodes data by generating ECC data, e.g., redundancy bits or parity bits, that are stored along with the data in a memory device. For example, 8 parity bits can be generated for 32 bits of data or 64 bits of data. An ECC that generates 8 bits of parity for 32 bits of data can usually detect two bit errors and correct one bit error in the 32 bits of data. Similarly, an ECC that generates 8 parity bits for 64 bits of data can usually detect two bit errors and correct one bit error in the 64 bits of data.

Typically, an ECC memory device is used in a system to provide ECC capability. An ECC memory device can include an extra memory chip that is designated for storing ECC information. An ECC memory device can also include an interface that can provide simultaneous access of a data word and its corresponding ECC information. For example, an ECC memory device that can provide 8-bit parity for each 32-bit data word may include a 40-bit wide interface to access a 32-bit data word. Similarly, an ECC memory device that can provide 8-bit parity for each 64-bit data word may include a 72-bit wide interface to access a 64-bit data word.

However, a consumer may desire stronger ECC protection than the ECC protection provided by an ECC memory device. Traditional ECC systems typically provide limited ECC capability because such systems generate and store limited ECC information. For example, a 72-bit ECC memory supports 8-bit parity for a 64-bit data word, which typically provides 1-bit error correction and 2-bit error detection. Traditional ECC systems typically cannot provide ECC capability with two or more bit error correction, which may be needed to protect critical system data when a memory is operating at a very high data rate.

Additionally, a consumer may choose to use a system that does not support an ECC memory device, but may still desire ECC capability. A system that supports an ECC memory device may be associated with higher costs than a system that does not support an ECC memory device. For example, system components, such as motherboards, chipsets, and processors, that support ECC memory devices may be more expensive than system components that do not support ECC memory devices. Even when a system supports an ECC memory device, a consumer may choose to use a non-ECC memory device, but still desire ECC capability. An ECC memory device may be more expensive than a non-ECC memory device because of the extra memory chip and wider interface provided by the ECC memory device to implement ECC functionality.

SUMMARY

The present disclosure describes systems and techniques relating to ECC capability for memory. In general, in one aspect, the disclosure describes a controller that is configured to identify an ECC protection level from a plurality of ECC protection levels for data that is to be stored in a memory device, generate ECC data for the data that is to be stored in a memory device using an ECC corresponding to the identified ECC protection level, store the generated ECC data in a cache, and store the data in the memory device According to another aspect of the described systems and techniques, a system includes a memory device and a controller. The controller is configured to determine that a level of error correcting code (ECC) protection to be applied to data stored in the memory device is to be switched from a first ECC protection level to a second ECC protection level, modify allocation of a portion of the memory device to redistribute the portion between an application data region that stores intermediate application data and an ECC data region that stores ECC data, generate ECC data for system data stored in the memory device using an ECC associated with the second ECC protection level, store the ECC data in the ECC data region, and switch from the first ECC protection level to the second ECC protection level.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

Details of one or more implementations are set forth in the accompanying drawings and the description below. Other features, objects, and advantages may be apparent from the description and drawings, and from the claims.

DETAILED DESCRIPTION

Various implementations of the present disclosure are discussed below in the context of ECC capability for a memory device. The systems and techniques described in this disclosure are generally applicable to any memory device for which it is desirable to provide ECC capability or variable ECC capability. While specific implementations of memory and memory controllers are illustrated and described, many other memory and memory controller implementations may exist that include components different than those illustrated and described below.

Figure 1:
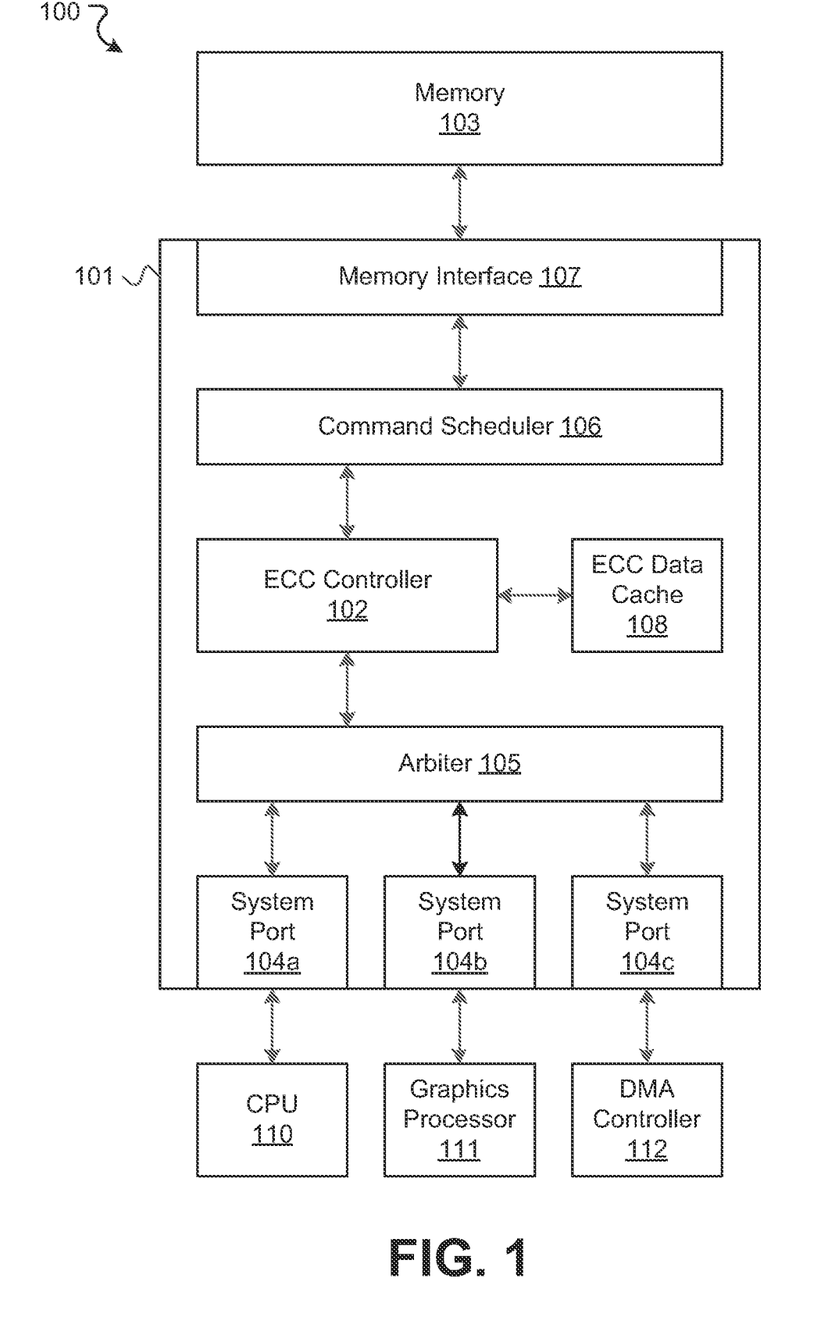
FIG. 1 is a block diagram showing an example of a system in which an ECC controller may be utilized to provide ECC capability for a memory.

FIG. 1 is a block diagram showing an example of a system 100 that includes a memory controller 101 in which an ECC controller 102 may be utilized to provide ECC capability for a memory 103. The memory controller 101 may include multiple system ports 104, an arbiter 105, and a command scheduler 106. The system ports 104 may connect the memory controller 101 to other components of the system 100, such as a central processing unit (CPU) 110, a graphics processor 111, and a direct memory access (DMA) controller 112. The arbiter 105 may perform arbitration of memory access requests from the system ports 104. The command scheduler 106 may schedule memory access requests from the ECC controller 102 based on various factors, such as memory bank status, access priority, and access type (e.g., read or write).

The memory controller 101 includes a memory interface 107 that connects the memory controller to the memory 103. The memory 103 may include any memory device for which it is desirable to provide ECC capability or variable ECC capability. In some implementations, the memory 103 may include a volatile memory, such as random-access memory (RAM), including a dynamic random-access memory (DRAM), a static random-access memory (SRAM), a double data rate random-access memory (DDR RAM), or other similar devices. In some implementations, the memory 103 may include a non-volatile memory, such as a flash memory, a hard disk, a floppy disk, a magnetic tape, or other persistent storage devices. The memory 103 may include one or more memory devices, chips, or modules.

The ECC controller 102 communicates with an ECC data cache 108. The ECC data cache 108 may be a high speed content addressable cache memory that temporarily stores ECC data. The ECC controller 102 stores ECC data, such as redundancy bytes or parity bytes, that form partial data words in the ECC data cache 108 to reduce access to the memory 103. The ECC controller 102 stores individual bytes of ECC data in the ECC data cache until a complete data word is formed. A data word is largest unit of data that can be transferred to and from the memory 103 in a single operation. The ECC controller 102 then writes the data word to the memory 103. When the ECC controller 102 receives a request to read or write data to the memory 103, the ECC controller 103 may check the ECC data cache 108 for associated ECC data before reading or writing ECC data to the memory 103.

For example, the ECC controller 102 may generate a 1-byte parity for an 8-byte block of data. The 1-byte parity may form a partial 8-byte data word. The ECC controller 102 may store the partial 8-byte data word in the ECC data cache until enough parity bytes are generated to form a complete 8-byte parity data word. The ECC controller 102 then writes the 8-byte parity data word to the memory 103.

The ECC controller 102 provides ECC capability for the memory 103. Providing ECC capability for a non-ECC memory may reduce the cost typically associated with a system having traditional ECC capability because a non-ECC memory is typically less expensive and uses less power than an ECC memory. A non-ECC memory is an integrated circuit device without ECC circuitry built into the device, whereas an ECC memory is an integrated circuit device with ECC circuitry built into the device. ECC circuitry built into an ECC memory may include an ECC controller, an additional memory chip, and a wider interface. Even though an ECC memory may include an additional memory chip and a wider interface, a non-ECC memory and an ECC memory can provide the same data throughput.

The ECC controller 102 may provide stronger ECC capability than traditional ECC systems by providing two or more bit error correction. For example, the ECC controller 102 may generate a 2-byte parity for each 8 bytes of data, which can provide 2-bit error correction and 3-bit error detection for 8 bytes of data. Traditional ECC systems typically provide limited ECC capability because such systems generate and store limited ECC information. For example, a 72-bit ECC memory supports 8-bit (1-byte) parity for a 64-bit (8-byte) data word, which typically provides 1-bit error correction and 2-bit error detection. Traditional ECC systems typically cannot provide ECC capability with two or more bit error correction, which may be needed to protect critical system data when a memory is operating at a very high data rate.

The ECC controller 102 may use an ECC to perform error detection, correction, or both on data of different lengths to provide different strengths of ECC protection. In some implementations, the ECC controller 102 may apply ECC to each byte of data, which is referred to in this disclosure as Low-Latency ECC (LL-ECC). For LL-ECC, the ECC controller 102 generates a 1-byte parity for each byte of data. LL-ECC provides each byte of data with 1-bit error correction and 2-bit error detection. LL-ECC provides stronger ECC protection and shorter access latency than ECC performed on larger blocks of data. Thus, LL-ECC may be suitable for memory accesses with random addresses and low latency access requirements, such as instruction fetch. LL-ECC may be suitable for protecting critical system data that requires strong ECC protection. The 1-byte data and 1-byte parity may be stored in adjacent bytes of the memory 103. The ECC controller 102 may use any suitable ECC to perform LL-ECC, such as enhanced Hamming code. Systems and techniques for providing LL-ECC capability for memory are described in more detail in U.S. application Ser. No. 13/682,552, filed Nov. 20, 2012, issued as U.S. Pat. No. 8,959,417 on Feb. 17, 2015, titled "Providing Low-Latency Error Correcting Code (LL-ECC) Capability for Memory."

In some implementations, the ECC controller 102 may use an ECC to perform error detection, correction, or both on a block of data, such as 4 bytes of data, 8 bytes of data, 16 bytes of data, or other block sizes, which is referred to in this disclosure as Block-ECC. For Block-ECC, the ECC controller 102 may generate one or more bytes of ECC data for each block of data. For example, the ECC controller 102 may generate a 1-byte parity for a 4-byte block of data, which provides 1-bit error correction and 2-bit error detection for 4 bytes of data. As another example, the ECC controller 102 may generate a 1-byte parity for an 8-byte block of data, which provides 1-bit error correction and 2-bit error detection for 8 bytes of data. As yet another example, the ECC controller 102 may generate a 2-byte parity for an 8-byte block of data, which provides 2-bit error correction and 3-bit error detection for 8 bytes of data. The data block size and parity size may be variable based on, for example, factors that affect the integrity of the data signal. Factors that affect the integrity of the data signal may include the data rate, clock frequency, temperature, or power consumption level at which the memory 103 is operating. Other factors that affect the integrity of the data signal may include external radiation and noise. The data and its corresponding ECC data can be stored in separate regions of the memory 103. The ECC controller 102 may use any suitable ECC to perform Block-ECC, such as enhanced Hamming code, Bose-Chaudhuri-Hocquenghem (BCH) code, Reed-Solomon (RS) code, Turbo code, or low-density parity-check (LDPC) code.

Figure 2:
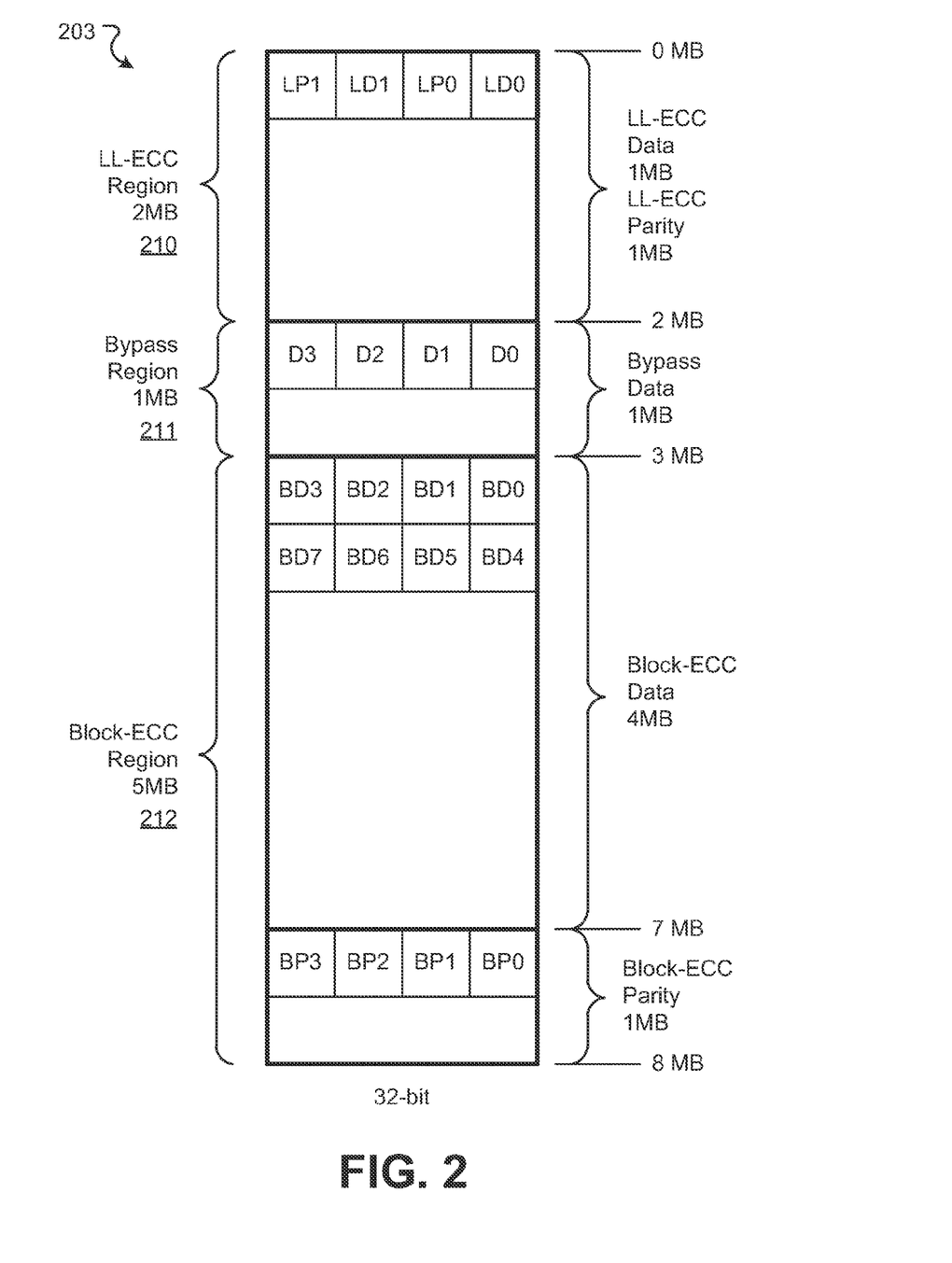
FIG. 2 shows an example of a memory having different regions that store data that are processed using different ECC protection.

FIG. 2 shows an example of a memory 203 having different regions that store different types of data that are processed using different levels ECC protection. A region may be a contiguous range of physical memory addresses. A region can be divided into individual bits or larger aggregate data units such as bytes.

The memory 203, as shown in FIG. 2, is a 32-bit memory having a capacity of 8 megabytes (MB). The memory 203 may include an LL-ECC region 210, a bypass region 211, and a Block-ECC region 212. The LL-ECC region 210 may be defined as the region from 0 MB to 2 MB with a total size of 2 MB. The bypass region 211 may be defined as the region from 2 MB to 3 MB with a total size of 1 MB. The Block-ECC region 212 may be defined as the region from 3 MB to 8 MB with a total size of 5 MB.

The LL-ECC region 210 stores data processed using LL-ECC and corresponding parity information. In LL-ECC, each ECC code word is a byte (8 bits of data). One byte of ECC data is generated for one byte of data. A data byte and its corresponding ECC byte are stored in adjacent byte locations. For example, as shown in FIG. 2, data byte LD0 is stored adjacent to its parity byte LP0. If a data byte is updated in memory, the corresponding ECC byte may also need to be updated. The data byte and the ECC byte have the same data masks, or write strobe so that a data word in memory can be updated with the data byte and the ECC byte.

Other components in the system may access half of the address space in the LL-ECC region 210. The components may access data in the LL-ECC region 210 using addresses of locations in the memory 203 from 0 MB to 1 MB. In some implementations, any memory access specifying an address in the LL-ECC region 210 from 1 MB to 2 MB is illegal. An illegal access may cause an error flag to be set, an error interrupt to be generated, or an error log to be created. When an ECC controller receives an access request with an address specifying a valid location of data in the LL-ECC region 210, the ECC controller may translate the received address to an address of the actual location of the data in the LL-ECC region 210. The address of the actual location of the data may be different than the received address because parity bytes are interleaved with the data bytes for storage in the LL-ECC region 210.

The bypass region 211 stores data that are not protected by ECC. All addresses in the bypass region 211 may be accessible to other components of the system.

The Block-ECC region 212 stores data processed using Block-ECC and corresponding parity information. Data and its corresponding parity byte can be stored in separate regions of the Block-ECC region 212. For Block-ECC that generates a 1-byte parity for each 8 bytes of data, data bytes may be stored in a region from 3 MB to 7 MB, and parity bytes may be stored in a region from 7 MB to 8 MB. For example, 8 data bytes BD0, BD1, BD2, BD3, BD4, BD5, BD6, BD7 are stored in the Block-ECC data region and the corresponding parity byte BP0 is stored in the Block-ECC parity region. The sizes of the Block-ECC data region and parity region may be varied based on the strength of the Block-ECC protection applied to the data. For example, the size of the Block-ECC data region may be smaller than 4 MB and the size of the Block-ECC parity region may be larger than 1 MB for Block-ECC that generates a 1-byte parity for 4 bytes of data or a 2-byte parity for 8 bytes of data.

Registers may be used to store the base addresses of different regions of the memory 203. For example, a register may be used to store the base address of the Block-ECC parity region. When an ECC controller receives an access request with an address specifying a location of data in the Block-ECC region 212, the ECC controller may calculate the address of the location of the corresponding parity byte based on the address of the data, the base address of the Block-ECC data region, the base address of the Block-ECC parity region, and the number of bytes of data processed for each parity byte. For the example shown in FIG. 2, the address of the location of the corresponding parity byte in the Block-ECC parity region may be calculated as follows: parity address=parity base address+(data address−data base address)/8.

Referring again to FIG. 1, the ECC controller 102 may switch between different ECC modes that have different ECC protection strengths based on, for example, factors that affect the integrity of the data signal, such as the data rate or clock frequency at which the memory 103 is operating. The memory 103 may be partitioned into different regions for storing data and any ECC information that is generated by the ECC controller 102 while operating in an ECC mode.

Figure 3A:
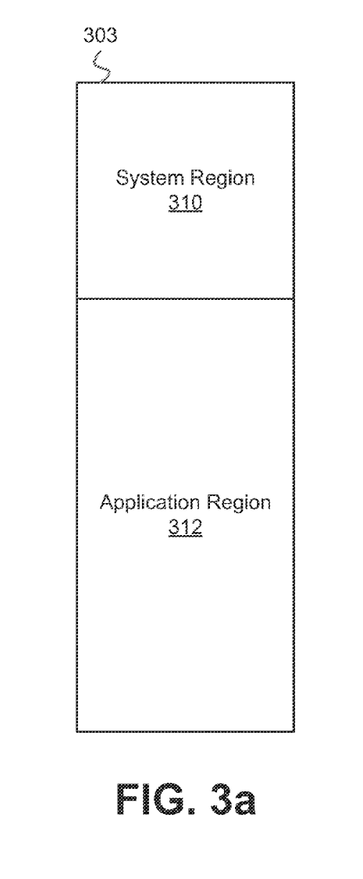
FIGS. 3a, 3b, and 3c show an example of a memory having different regions that may vary in size based on ECC modes that provide Block-ECC protection.
Figure 3B:
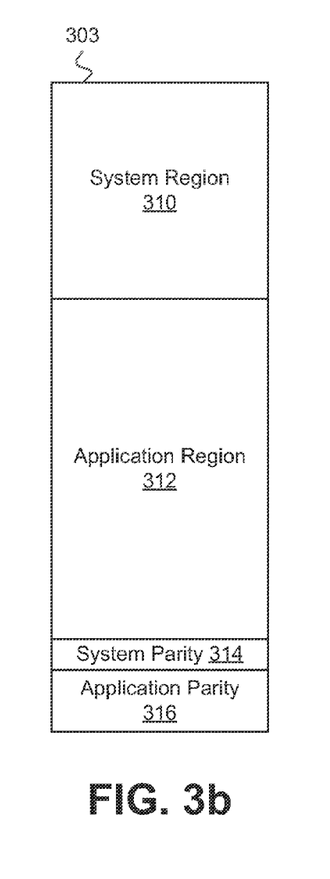
Figure 3C:
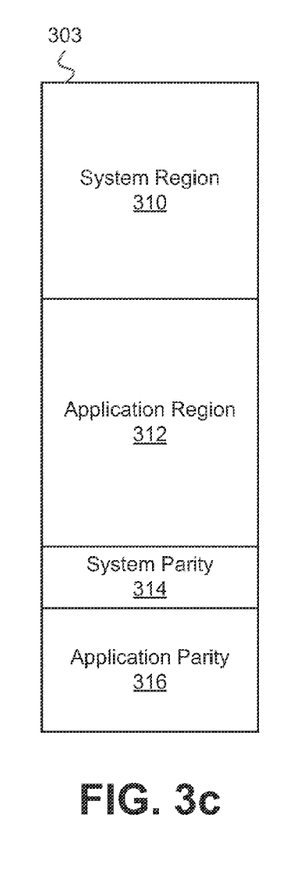

FIGS. 3a, 3b, and 3c show an example of a memory 303 having different regions that may vary in size based on ECC modes that provide Block-ECC protection. The area of the memory 303 accessible by system components includes a system region 310 and an application region 312. The system region 310 may store critical system data such as CPU code. The application region 312 may store intermediate application data such as temporary data associated with calculations and buffers.

The memory 303 may include an area not accessible by other system components for storing ECC information, such as a system parity region 314 and an application parity region 316. The system parity region 314 may store parity information associated with the critical system data. The application parity region 316 may store parity information associated with the intermediate application data. In the examples of FIGS. 3b and 3c, an ECC controller applies Block-ECC to different sized blocks of data corresponding to the ECC mode.

FIG. 3a shows an example of the memory 303 with regions corresponding to a non-ECC mode where data is processed without applying ECC to the data. An ECC controller may process data without applying ECC to the data when the memory 303 is operating at a low clock speed, such as a clock speed less than 400 MHz. In the non-ECC mode, the memory 303 includes the system region 310 and the application region 312. Because the ECC controller processes data without applying ECC, the system parity region 314 and the application parity region 316 are not needed in the non-ECC mode.

FIG. 3b shows an example of the memory 303 with regions corresponding to a medium strength ECC mode. An ECC controller may apply medium strength ECC protection when the memory 303 is to be operated at a medium clock speed, such as a clock speed between 400 MHz and 800 MHz. In medium strength ECC mode, the memory 303 includes the system region 310, the application region 312, the system parity region 314, and the application parity region 316. The ratio of the area that is accessible by other system components, e.g., the system region 310 and the application region 312, to the area for storing ECC information, e.g., the system parity region 314 and the application parity region 316, may be defined as 8 to 1. In this implementation, the ECC controller may generate a 1-byte parity for each 8 bytes of data, which can provide 1-bit error correction and 2-bit error detection for 8 bytes of data. For the medium strength ECC mode, the ECC controller may use any suitable ECC such as enhanced Hamming code.

FIG. 3c shows an example of the memory 303 with regions corresponding to a high strength ECC mode. An ECC controller may apply high strength ECC protection when the memory 303 is to be operated at a high clock speed, such as a clock speed greater than 800 MHz. In high strength ECC mode, the memory 303 includes the system region 310, the application region 312, the system parity region 314, and the application parity region 316. The ratio of the area that is accessible by other system components, e.g., the system region 310 and the application region 312, to the area for storing ECC information, e.g., the system parity region 314 and the application parity region 316, may be defined as 8 to 2. In this implementation, the ECC controller may generate a 2-byte parity for each 8 bytes of data, which can provide 2-bit error correction and 3-bit error detection for 8 bytes of data. For high strength ECC mode, the ECC controller may use any suitable ECC such as BCH code. Other implementations may include additional or different ECC modes and data to parity ratios.

Figure 4A:
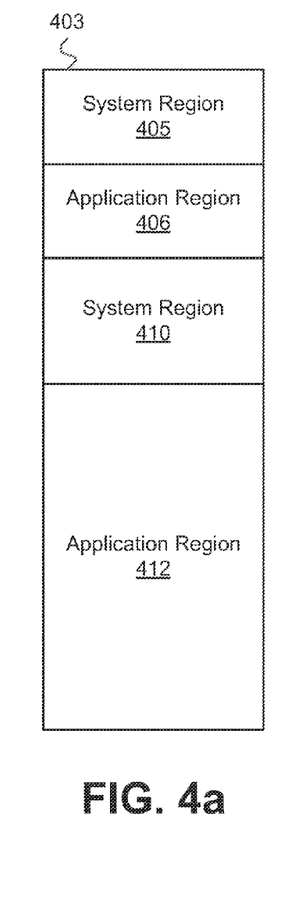
FIGS. 4a, 4b, and 4c show an example of a memory having different regions that may vary in size based on ECC modes that provide LL-ECC and Block-ECC protection.
Figure 4B:
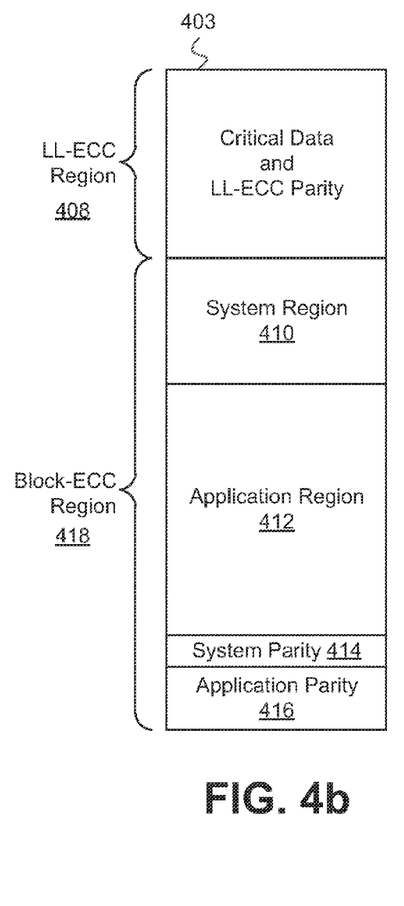
Figure 4C:
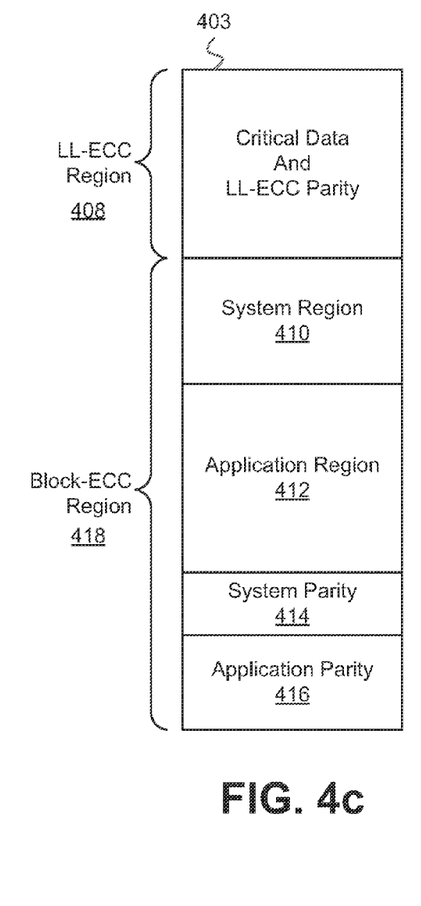

FIGS. 4a, 4b, and 4c show examples of a memory 403 having different regions that may vary in size based on ECC modes that provide LL-ECC and Block-ECC protection. The area of the memory 403 accessible by system components includes a first system region 405, a first application region 406, a second system region 410, and a second application region 412. The first system region 405 may store critical system data, such as instructions, that require high ECC protection strength and low latency access. The second system region 410 may store other system data that does not require low latency access. The application regions 406 and 412 may store intermediate application data such as temporary data associated with calculations and buffers.

In the examples of FIGS. 4b and 4c, an ECC controller may apply different ECC protection to different types of data stored in different regions of the memory 403. For example, the ECC controller may apply LL-ECC to the critical system data stored in the first system region 405. The memory 403 may include an LL-ECC region 408. The LL-ECC region 408 may store critical system data that is processed using LL-ECC and corresponding parity information. The LL-ECC region 408 may be formed by combining the system region 405 and the application region 406 to accommodate the critical system data and the parity information.

In FIGS. 4b and 4c, the ECC controller applies Block-ECC to data stored in the second system region 410 and the application region 412. The memory 403 may include a Block-ECC region 418. The Block-ECC region 418 may include the system region 410, the application region 412, a system parity region 414, and an application parity region 416. The system parity region 414 may store parity information associated with the system data stored in the second system region 410. The application parity region 416 may store parity information associated with the intermediate application data stored in the second application region 412.

FIG. 4a shows an example of the memory 403 with regions corresponding to a non-ECC mode where data is processed without applying ECC to the data. An ECC controller may process data without applying ECC to the data when the memory 403 is operating at a low clock speed, such as a clock speed less than 400 MHz. In the non-ECC mode, the memory 403 includes the first system region 405, the first application region 406, the second system region 410, and the second application region 412. Because the ECC controller processes data without applying ECC, the regions for storing parity information are not needed in the non-ECC mode.

FIG. 4b shows an example of the memory 403 with regions corresponding to a medium strength mixed ECC mode where LL-ECC is applied to data stored in the LL-ECC region 408 and medium strength Block-ECC is applied to data stored in the Block-ECC region 418. An ECC controller may operate in the medium strength mixed ECC mode when the memory 403 is to be operated at a medium clock speed, such as a clock speed between 400 MHz and 800 MHz.

In medium strength mixed ECC mode, the memory 403 includes the LL-ECC region 408 and the Block-ECC region 418. The LL-ECC region 408 may store critical system data that is processed using LL-ECC and corresponding parity information. The Block-ECC region 418 includes the system region 410, the application region 412, the system parity region 414, and the application parity region 416. In the Block-ECC region 418, the ratio of the area that is accessible by other system components, e.g., the system region 410 and the application region 412, to the area for storing parity information, e.g., the system parity region 414 and the application parity region 416, may be defined as 8 to 1. In this implementation, the ECC controller may generate a 1-byte parity for each 8 bytes of data stored in the Block-ECC region 418, which can provide 1-bit error correction and 2-bit error detection for 8 bytes of data. For the medium strength mixed ECC mode, the ECC controller may use any suitable ECC, such as enhanced Hamming code, to perform LL-ECC and Block-ECC.

FIG. 4c shows an example of the memory 403 with regions corresponding to a high strength mixed ECC mode where LL-ECC is applied to data stored in the LL-ECC region 408 and high strength Block-ECC is applied to data stored in the Block-ECC region 418. An ECC controller may operate in the high strength mixed ECC mode when the memory 403 is to be operated at a high clock speed, such as a clock speed greater than 800 MHz.

In high strength mixed ECC mode, the memory 403 includes the LL-ECC region 408 and the Block-ECC region 418. The LL-ECC region 408 may store critical system data that is processed using LL-ECC and corresponding parity information. The Block-ECC region 418 includes the system region 410, the application region 412, the system parity region 414, and the application parity region 416. In the Block-ECC region 418, the ratio of the area that is accessible by other system components, e.g., the system region 410 and the application region 412, to the area for storing parity information, e.g., the system parity region 414 and the application parity region 416, may be defined as 8 to 2. In this implementation, the ECC controller may generate a 2-byte parity for each 8 bytes of data, which can provide 2-bit error correction and 3-bit error detection for 8 bytes of data. For high strength mixed ECC mode, the ECC controller may use any suitable ECC, such as enhanced Hamming code for LL-ECC and BCH code for Block-ECC. Other implementations may include additional or different ECC modes and data to parity ratios.

Figure 5:
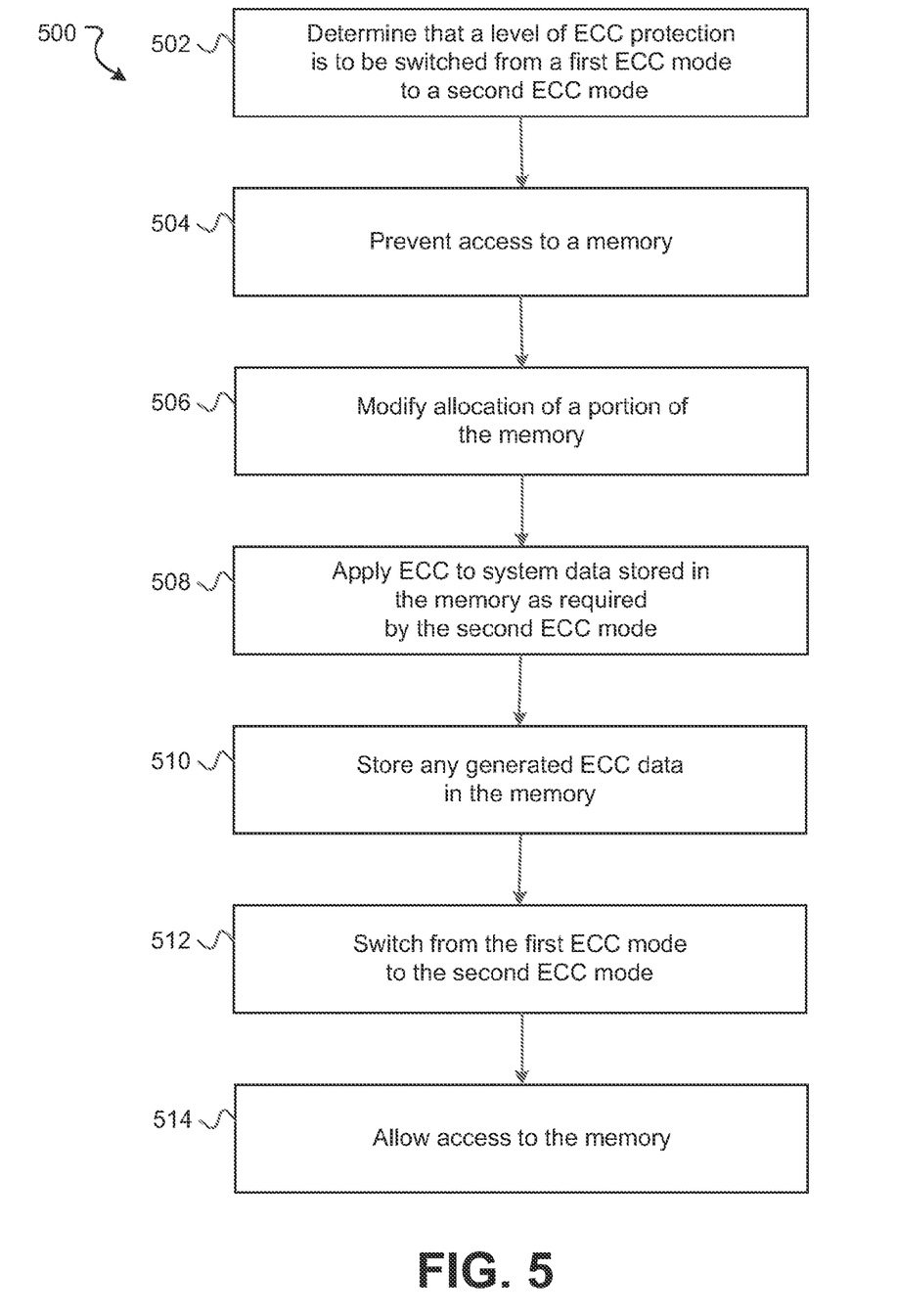
FIG. 5 is a flowchart showing examples of operations performed by an ECC controller to switch ECC modes.

FIG. 5 is a flowchart showing examples of operations 500 performed by an ECC controller to switch ECC modes. At 502, the ECC controller determines that a level of ECC protection to be applied to data stored in a memory is to be switched from a first ECC protection level corresponding to a first ECC mode to a second ECC protection level corresponding to a second ECC mode. The ECC controller may determine to switch ECC modes based on a change in the system that may affect the integrity of data stored in the memory. For example, the ECC controller may determine to switch ECC modes based on a request or a command to change a clock frequency used to operate the memory or the amount of power supplied to the memory.

At 504, the ECC controller may prevent other system components from accessing the memory while the ECC controller processes the data stored in the memory. To prevent other systems from accessing the memory, the ECC controller may cause the memory controller to temporarily stop accepting access commands from the system components. The memory controller and the system components may have some bus protocol or handshaking mechanism for transferring data between the memory and the system component. For example, a system component sends an access command to the memory controller by sending a request signal to the memory controller. The memory controller may send an acknowledgement signal to the system component to indicate that it is ready to accept the access command. When the ECC controller is switching ECC modes, the memory controller may deassert, or refrain from sending, the acknowledgement signal to indicate that the memory controller is not accepting any new access commands. The memory controller may process all access commands that have already been accepted. After all accepted access commands have been processed, the ECC controller may then process the data stored in the memory.

At 506, the ECC controller modifies allocation of a portion of the memory. If the ECC controller is switching from a non-ECC mode to an ECC mode, the ECC controller may modify allocation of a portion of the memory to create a region for storing ECC information. In some implementations, the ECC controller may deallocate a portion of an application region and allocate the deallocated portion to create an LL-ECC region. In some implementations, the ECC controller may deallocate a portion of an application region and allocate the deallocated portion to create parity regions for Block-ECC.

If the ECC controller is switching from an ECC mode to a non-ECC mode, the ECC controller may modify allocation of a portion of the memory to eliminate a region that stores ECC information. In some implementations, the ECC controller may deallocate a portion of an LL-ECC region and allocate the deallocated portion to create an application region. In some implementations, the ECC controller may deallocate parity regions that store parity information for Block-ECC and allocate the deallocated regions to an application region.

If the ECC controller is switching from a medium strength ECC mode to a high strength ECC mode, the ECC controller may modify allocation of a portion of the memory to adjust the ratio of a system region to a system parity region and the ratio of an application region to an application parity region from, for example, 8:1 to 8:2 for Block-ECC. The ECC controller may deallocate a portion of the application region and deallocate the system parity region and the application parity region. Before deallocating the system parity region, the ECC controller may copy the parity data stored in the system parity region to a temporary location in the memory or another memory. The ECC controller may allocate the deallocated portions and regions to create a larger system parity region and a larger application parity region.

If the ECC controller is switching from a high strength ECC mode to a medium strength ECC mode, the ECC controller may modify allocation of a portion of the memory to adjust the ratio of a system region to a system parity region and the ratio of an application region to an application parity region from, for example, 8:2 to 8:1 for Block-ECC. The ECC controller may deallocate the system parity region and the application parity region. Before deallocating the system parity region, the ECC controller may copy the parity data stored in the system parity region to a temporary location in the memory or another memory. The ECC controller may allocate the deallocated regions to create a smaller system parity region and a smaller application parity region.

At 508, the ECC controller applies an ECC to system data stored in a system region of the memory as required by the second ECC mode. If the second ECC mode provides no ECC protection, the ECC controller does not apply ECC to the system data. If the second ECC mode provides LL-ECC protection, the ECC controller applies LL-ECC to system data stored in a system region. If the second ECC mode provides medium strength Block-ECC protection, the ECC controller applies medium strength Block-ECC protection to system data stored in a system region. If the second ECC mode provides high strength Block-ECC protection, the ECC controller applies high strength Block-ECC protection to system data stored in a system region.

To apply ECC protection to system data, the ECC controller reads the system data from a system region of the memory. If the system data is associated with stored ECC data, the ECC controller reads the stored ECC data and performs error correction on the system data according to the first ECC mode. The ECC controller then generates new ECC data for the system data according to the second ECC mode.

At 510, the ECC controller stores any generated ECC data in an ECC data region of the memory. For example, for parity data generated for system data using LL-ECC, the ECC controller stores the parity data in an LL-ECC region of the memory. For parity data generated for system data using Block-ECC, the ECC controller stores the parity data in a system parity region of the memory.

At 512, the ECC controller switches from the first ECC mode to the second ECC mode. The command or request that triggered the ECC mode switch may be processed to, for example, change the clock frequency used to operate the memory.

At 514, the ECC controller allows other system components to access the memory. To allow other system components to access the memory, the ECC controller causes the memory controller to resume accepting access commands. When the memory controller receives a request signal from a system component, the memory controller may send an acknowledgement signal to the system component to indicate that it is ready to accept the access command. The ECC controller processes any data transferred between the memory and the other system components according to the second ECC mode.

Figure 6:
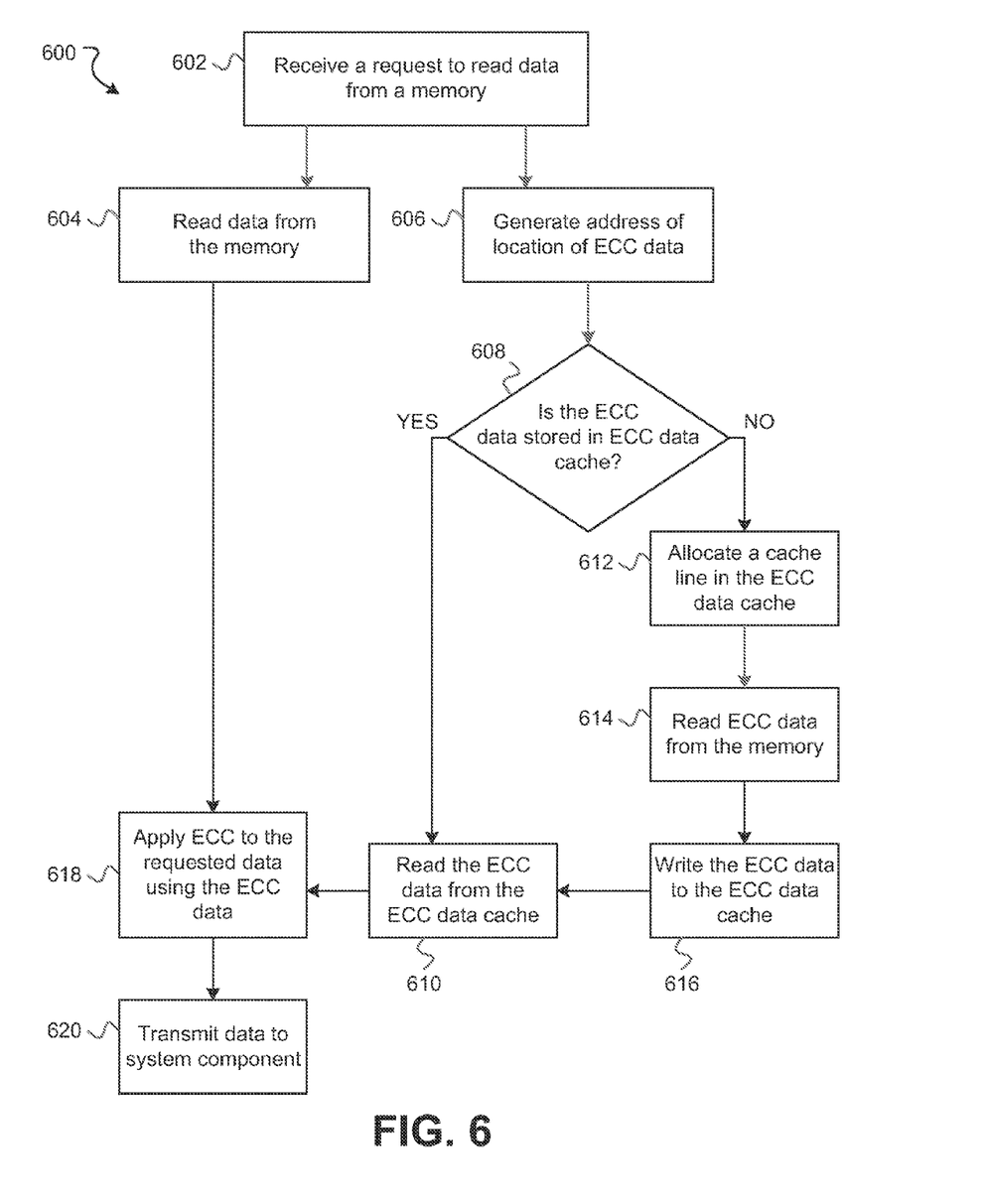
FIG. 6 is a flowchart showing examples of operations performed by an ECC controller to read ECC protected data from a memory.

FIG. 6 is a flowchart showing examples of operations 600 performed by an ECC controller to read ECC protected data from a memory. At 602, the ECC controller receives a request from a system component to read data from a memory. The request includes an address of the location of the memory where the data is stored. At 604, the ECC controller reads the data from the memory.

At 606, the ECC controller generates the address of the location of the memory where corresponding ECC data is stored. The ECC controller may generate the address associated with the ECC data based on the address of the location of the memory where the corresponding data is stored. For Block-ECC, for example, the address of the location of the parity byte corresponding to an 8-byte block of data may be calculated as follows: parity address=parity base address+(data address−data base address)/8, where the parity base address is the starting address of the Block-ECC parity region and the data base address is the starting address of the Block-ECC data region.

At 608, the ECC controller checks whether the ECC data is stored in an ECC data cache. The ECC controller may use an address associated with the ECC data to check whether the ECC data is stored in the ECC data cache. For example, if a cache entry storing ECC data is associated with an address specifying the location of the memory where the corresponding data is stored, the ECC controller may use the received address specifying the location of the memory where the data is stored to check whether the ECC data is stored in the ECC data cache. As another example, if the cache entry storing ECC data is associated with a generated address specifying the location of the memory where the ECC data is stored, the ECC controller may use the generated address of the location of the memory where the ECC data is stored to check whether the ECC data is stored in the ECC data cache. The ECC data may be stored in the ECC data cache if the ECC data is part of a partial data word that has not been written to the memory. If the ECC data is stored in the ECC data cache, the ECC controller reads the ECC data from the ECC data cache at 610.

If the ECC data is not stored in the ECC data cache, the ECC controller allocates a cache entry in the ECC data cache at 612. The cache entry stores the ECC data that is to be read from the memory. In some implementations, the cache entry may be used to store the data word including the ECC data that is to be read from the memory. At 614, the ECC controller reads the ECC data from the memory. The ECC controller writes the ECC data to the allocated cache entry in the ECC data cache at 616. At 610, the ECC controller reads the ECC data from the ECC data cache for processing.

At 618, the ECC controller performs error detection, correction, or both on the requested data using the ECC data. At 620, the ECC controller transmits the requested data to the system component.

Figure 7:
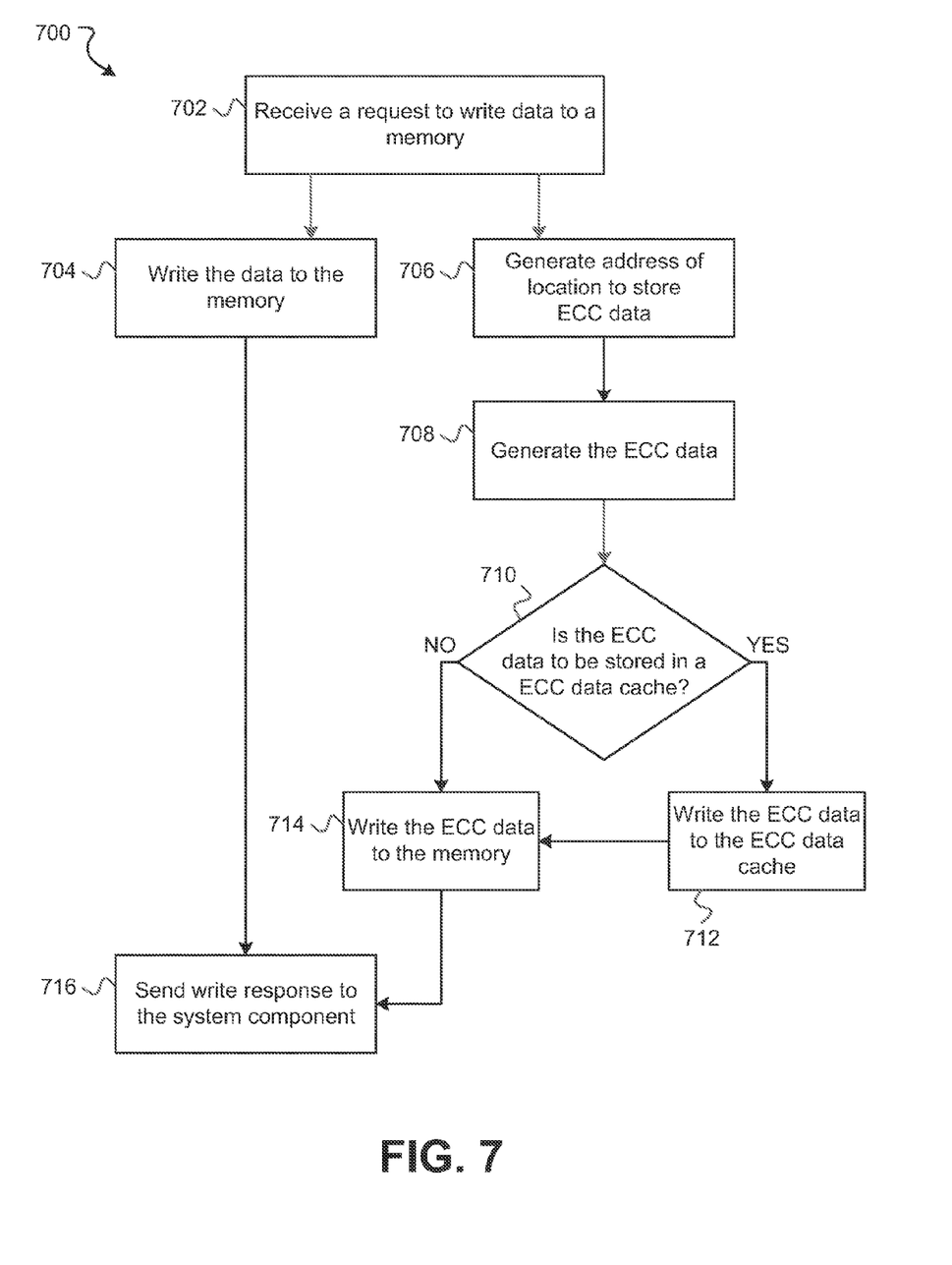
FIG. 7 is a flowchart showing examples of operations performed by an ECC controller to write ECC protected data to a memory.

FIG. 7 is a flowchart showing examples of operations 700 performed by an ECC controller to write ECC protected data to a memory. At 702, the ECC controller receives a request from a system component to write data to a memory. The request includes an address of the location of the memory where the data is to be stored. At 704, the ECC controller writes the data to the memory.

At 706, the ECC controller generates the address of the location of the memory where corresponding ECC data is to be stored. The ECC controller may generate the address associated with the ECC data based on the address of the location of the memory where the corresponding data is to be stored. At 708, the ECC controller generates the ECC data.

At 710, the ECC controller checks whether the ECC data is to be stored in an ECC data cache. The ECC controller checks whether the ECC data is to be stored in the ECC data cache by searching the ECC data cache for a cache entry associated with an address that matches an address associated with the ECC data. The ECC controller and the ECC data cache may use the received address specifying the location of the memory where the data is to be stored or the generated address specifying the location of the memory where the ECC data is to be stored.

The ECC controller may store the ECC data in the ECC data cache if the ECC data is part of a partial data word that has not been written to the memory. If the ECC data is to be stored in the ECC data cache, the ECC controller writes the ECC data to the ECC data cache at 712.

At 714, the ECC controller may write the ECC data to the memory. In some implementations, the ECC controller may store ECC data that forms a partial data word in the ECC data cache until a complete data word is formed. The ECC controller then writes the data word to the memory. The ECC controller may remove the data word from the ECC data cache after writing the data word to the memory. If the ECC data has already been written to the memory, the ECC data is not to be stored in the ECC data cache. If the ECC data is not to be stored in the ECC data cache, the ECC controller writes the ECC data directly to the memory without storing the data word in the ECC data cache at 714. The ECC controller may write the ECC data directly to the memory using a data mask such that only the bytes of the data word where the ECC data is to be stored is updated. At 716, the ECC controller may send a write response to the system component to notify the system component that the data has been written to the memory.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including system on chip (SoC) implementations.

While this specification contains many specifics, these should not be construed as limitations on the scope of what may be claimed, but rather as descriptions of features that may be specific to particular embodiments. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Other implementations fall within the scope of the following claims. For example, in some implementations, the described systems and techniques may be applicable to a traditional ECC memory device to provide ECC capability that is stronger than the ECC capability provided by the ECC memory device.

What is claimed is:

1. An apparatus, comprising:
a cache configured to store error correcting code (ECC) data; and
a controller coupled to the cache, the controller configured to:
identify an ECC protection level from a plurality of ECC protection levels for a block of data that is to be stored in a memory device,
generate ECC data for the block of data that is to be stored in the memory device using an ECC corresponding to the identified ECC protection level,
store the generated ECC data in the cache as a portion of an ECC word, the ECC word including another portion that stores ECC data generated for a different block of data,
store the block of data in the memory device, and
store the ECC word in the memory device when the ECC word is a complete data word associated with the memory device.

2. The apparatus of claim 1, wherein the controller is configured to identify the ECC protection level based on (i) a location of the memory device where the block of data is to be stored, (ii) a type of the block of data that is to be stored in the memory device, or (iii) an operating condition of the memory device.

3. The apparatus of claim 2, wherein the controller is configured to identify the ECC protection level based on the operating condition of the memory device, and the operating condition of the memory device comprises a clock frequency used to operate the memory device.

4. The apparatus of claim 1, wherein the plurality of ECC protection levels are associated with a plurality of ECCs that are applied to data in a plurality of data lengths.

5. The apparatus of claim 1, wherein the plurality of ECC protection levels are associated with a plurality of ECCs that generate ECC data having a plurality of data lengths.

6. The apparatus of claim 1, wherein the controller is further configured to:
generate one or more addresses associated with one or more locations of the memory device where the generated ECC data is stored,
determine that the one or more addresses are associated with the generated ECC data stored in the cache, and
use the generated ECC data stored in the cache to detect or correct one or more errors in the block of data stored in the memory device.

7. A system, comprising:
a memory device; and
a controller configured to:
determine that a level of error correcting code (ECC) protection to be applied to data stored in the memory device is to be switched from a first ECC protection level to a second ECC protection level,
modify allocation of a portion of the memory device to redistribute the portion between an application data region that stores application data and an ECC data region that stores ECC data,
generate ECC data for system data stored in the memory device using an ECC associated with the second ECC protection level,
store the ECC data in the ECC data region, and
switch from the first ECC protection level to the second ECC protection level,
wherein the controller configured to generate the ECC data for the system data stored in the memory device using the ECC associated with the second ECC protection level comprises the controller configured to:
read the system data from the memory device,
perform error correction on the system data using an ECC and ECC data associated with the first ECC protection level, and
generate ECC data for the corrected system data using the ECC associated with the second ECC protection level.

8. The system of claim 7, wherein:
the second ECC protection level provides stronger ECC protection of the system data than the first ECC protection level; and
the controller configured to modify allocation of the portion of the memory device comprises the controller configured to:
deallocate a portion of the application data region, and
allocate the deallocated portion to the ECC data region.

9. The system of claim 7, wherein:
the second ECC protection level provides weaker ECC protection of the system data than the first ECC protection level; and
the controller configured to modify allocation of the portion of the memory device comprises the controller configured to:
deallocate a portion of the ECC data region, and
allocate the deallocated portion to the application data region.

10. The system of claim 7, wherein the controller is configured to determine that the level of ECC protection to be applied to the data stored in the memory device is to be switched from the first ECC protection level to the second ECC protection level based on a change in a clock frequency used to operate the memory device.

11. The system of claim 7, wherein the first ECC protection level and the second ECC protection level are associated with different ECCs that are applied to data in different data lengths.

12. The system of claim 7, wherein the first ECC protection level and the second ECC protection level are associated with different ECCs that generate ECC data having different data lengths.

13. A method, comprising:
determining that a level of error correcting code (ECC) protection to be applied to data stored in the memory device is to be switched from a first ECC protection level to a second ECC protection level;
modifying allocation of a portion of the memory device to redistribute the portion between an application data region that stores application data and an ECC data region that stores ECC data;
generating ECC data for system data stored in the memory device using an ECC associated with the second ECC protection level;

storing the ECC data in the ECC data region; and switching from the first ECC protection level to the second ECC protection level, wherein generating the ECC data for the system data stored in the memory device using the ECC associated with the second ECC protection level comprises:

reading the system data from the memory device;

performing error correction on the system data using an ECC and ECC data associated with the first ECC protection level; and generating ECC data for the corrected system data using the ECC associated with the second ECC protection level.

14. The method of claim 13, wherein:

the second ECC protection level provides stronger ECC protection of the system data than the first ECC protection level; and modifying allocation of the portion of the memory device comprises:

deallocating a portion of the application data region, and allocating the deallocated portion to the ECC data region.

15. The method of claim 13, wherein:

the second ECC protection level provides weaker ECC protection of the system data than the first ECC protection level; and modifying allocation of the portion of the memory device comprises:

deallocating a portion of the ECC data region, and allocating the deallocated portion to the application data region.

16. The method of claim 13, wherein determining that the level of ECC protection to be applied to the data stored in the memory device is to be switched from the first ECC protection level to the second ECC protection level is based on a change in a clock frequency used to operate the memory device.

* * * * *